US008456434B2

(12) United States Patent
Moon et al.

(10) Patent No.: US 8,456,434 B2
(45) Date of Patent: Jun. 4, 2013

(54) TOUCH SENSOR AND OPERATING METHOD THEREOF

(75) Inventors: Byung-Joon Moon, Yongin-si (KR); Sang-Yun Han, Yongin-si (KR); Jae-Surk Hong, Yongin-si (KR); Duck-Young Jung, Yongin-si (KR)

(73) Assignee: Atlab Inc. (KR)

( * ) Notice: Subject to any disclaimer, the term of this patent is extended or adjusted under 35 U.S.C. 154(b) by 722 days.

(21) Appl. No.: 12/710,939

(22) Filed: Feb. 23, 2010

(65) Prior Publication Data

US 2010/0212975 A1    Aug. 26, 2010

Related U.S. Application Data

(63) Continuation-in-part of application No. 12/297,401, filed on Oct. 16, 2008.

(30) Foreign Application Priority Data

Jun. 22, 2006  (KR) .................. 10-2006-0056539
Feb. 23, 2009  (KR) .................. 10-2009-0014944

(51) Int. Cl.
  *G06F 3/041*  (2006.01)
  *G09G 5/00*  (2006.01)
(52) U.S. Cl.
  USPC ........................................ 345/173; 345/156
(58) Field of Classification Search
  USPC .................. 345/156–184; 178/18.01–20.04
  See application file for complete search history.

(56) References Cited

U.S. PATENT DOCUMENTS 5,036,321 A    7/1991  Leach et al.
5,760,688 A    6/1998  Kasai
(Continued)

FOREIGN PATENT DOCUMENTS

CN    1705232    12/2005
CN    101194172    6/2008
(Continued)

OTHER PUBLICATIONS

Korean Office Action—Korean Application No. 10-2011-0007534 issued Apr. 7, 2011.

(Continued)

*Primary Examiner* — Alexander Eisen
*Assistant Examiner* — Patrick F Marinelli
(74) *Attorney, Agent, or Firm* — Cantor Colburn LLP

(57) ABSTRACT

Provided are a touch sensor and a method of operating the same. The touch sensor includes: a pulse signal generator for generating a pulse signal of which pulse width is calibrated in response to a control code; a pulse signal transmitter for transmitting the pulse signal when a touch object is out of contact with a touch pad and stopping transmitting the pulse signal when the touch object is in contact with the touch pad; a pulse signal detector for detecting the pulse signal transmitted through the pulse signal transmitter; and a controller recognizing a non-contact state and adjusting the control code to calibrate the pulse width of the pulse signal when the pulse signal detector detects the pulse signal. In the above-described configuration, the contact of the touch object with the touch pad can be sensed more precisely, and the occurrence of a malfunction in the touch sensor due to changed operating conditions can be prevented. As a result, the operating reliability of the touch sensor can be enhanced.

11 Claims, 18 Drawing Sheets

U.S. PATENT DOCUMENTS

| | | | |
|---|---|---|---|
| 7,075,316 B2 | 7/2006 | Umeda et al. | |
| 7,605,805 B2 * | 10/2009 | Jung et al. | 345/173 |
| 7,956,850 B2 * | 6/2011 | Moon et al. | 345/173 |
| 2006/0007181 A1 * | 1/2006 | Jung et al. | 345/173 |
| 2008/0204422 A1 * | 8/2008 | Moon et al. | 345/173 |
| 2008/0295603 A1 * | 12/2008 | Shin et al. | 73/753 |
| 2009/0095542 A1 * | 4/2009 | Moon et al. | 178/18.06 |
| 2010/0188359 A1 * | 7/2010 | Lee | 345/174 |

FOREIGN PATENT DOCUMENTS

| | | |
|---|---|---|
| CN | 101313472 | 11/2008 |
| CN | 101359011 | 2/2009 |
| JP | 63-075919 | 4/1988 |
| JP | 04-239217 | 8/1992 |
| JP | 07-225137 | 8/1995 |
| JP | 09-245557 | 9/1997 |
| KR | 10-2002-0006984 | 1/2002 |
| KR | 10-2002-0077836 | 10/2002 |
| KR | 10-2005-0055156 | 6/2005 |
| KR | 10-2005-0115170 | 12/2005 |
| KR | 10-2006-0101821 | 9/2006 |
| KR | 10-2006-0131579 | 12/2006 |
| KR | 10-2007-0005472 | 1/2007 |
| KR | 10-2007-0057565 | 6/2007 |
| WO | 2007/061172 | 5/2007 |
| WO | WO 2007148873 A1 * | 12/2007 |

OTHER PUBLICATIONS

Japan Decision of Grant—Japanese Application No. 2009-506423 issued Apr. 26, 2011.
Korean Decision of Grant—Korean Application No. 10-2009-0014944 issued on Jul. 11, 2011, citing KR 10-2007-0057565, KR 10-0802656, and KR 10-2007-0005472.
Chinese Office Action—Chinese Application No. 201010118229.7 issued on Jul. 3, 2012, citing CN101313472, CN101194172, CN101359011, US7075316 and Shen, et al.
Shen, et al., New Type Charge Balance Differential Capacitance Micrometer, Instrument Technique and Sensor, 2005, p. 24-26.
Chinese Office Action—Chinese Application No. 2007800096430 issued Aug. 9, 2010.
Korean Office Action—Korean Patent Application No. 10-2009-0014944 issued on Nov. 29, 2010, citing KR10-2007-0057565.
Japanese Office Action—Japanese Application No. 2010-037291 issued on Mar. 13, 2012, citing WO 2007/061172 and JP 07-225137.
Chinese Office Action—Chinese Application No. 200780009643.0 issued on Apr. 8, 2011, citing US5760688.
International Search Report—PCT/KR2007/002134 dated Aug. 2, 2008.
Written Opinion—PCT/KR2007/002134 dated Aug. 2, 2008.

* cited by examiner

TOUCH SENSOR AND OPERATING METHOD THEREOF

TECHNICAL FIELD

The present invention relates to a touch sensor, and more particularly, to a touch sensor capable of sensing whether or not a touch object is in contact with the touch sensor using an electrostatic capacitance of the touch object.

BACKGROUND ART

The present invention relates to U.S. Pat. No. 7,605,805 which was applied by the same applicant.

Korean Patent Application No. 2005-23382 discloses a touch sensor as shown in FIG. 1, which senses whether or not a touch object is in contact with the touch sensor by varying a difference in delay time between a touch signal and a reference signal using the electrostatic capacitance of the touch object.

Referring to FIG. 1, the touch sensor includes a reference signal generator 10, a first signal generator 21, a second signal generator 22, a touch signal generator 30, and a low pass filter (LPF) 40. Specifically, the reference signal generator 10 generates a reference signal ref_sig. The first signal generator 21, which includes a resistor R11 and a capacitor CAP, delays the reference signal ref_sig by a constant delay time irrespective of whether or not the touch object is in contact with the touch sensor, and generates a first signal sig1. The second signal generator 22, which includes a resistor R12 and a touch pad PAD, delays the reference signal ref_sig by a variable delay time according to the electrostatic capacitance of the touch object and generates a second signal sig2. The touch signal generator 30, which includes a D-flip-flop, latches the second signal sig2 in response to the first signal sig1 and generates a touch signal con_sig. The LPF 40 filters the touch signal con_sig and outputs a filtered signal.

The touch signal generator 30 generates a touch signal con_sig having a first level when the touch object is brought into contact with the touch pad PAD and the second signal sig2 has a longer delay time than the first signal sig1. On the other hand, the touch signal generator 30 generates a touch signal con_sig having a second level when the touch object is out of contact with the touch pad PAD and the second signal sig2 has a shorter delay time than the first signal sig1.

As described above, the touch sensor of FIG. 1 varies a difference in delay time between the first signal sig1 and the second signal sig2 depending on whether or not the touch object is in contact with the touch pad PAD.

However, when the touch pad PAD has poor touch sensitivity or the touch object has very small electrostatic capacitance, a difference in delay time between the first signal sig1 and the second signal sig2 cannot be sufficiently varied, so that a malfunction may occur in the touch sensor.

Furthermore, the impedance of a circuit device included in each of the first and second signal generators 21 and 22 and a delay difference between the first and second signals sig1 and sig2 may vary with operating conditions of the touch sensor, such as an operating power supply voltage and the temperature and humidity of the atmosphere.

However, although the impedance of the circuit device included in each of the first and second signal generators 21 and 22 is changed according to the operating conditions, the conventional touch sensor provides no calibration element. As a result, the operating characteristics of the touch sensor are varied according to the operating conditions and, what is worse, a malfunction may occur in the touch sensor.

DISCLOSURE

Technical Problem

The present invention is directed to a touch sensor and a method of operating the same in which the contact of a touch object with the touch sensor is precisely sensed.

Also, the present invention is directed to a touch sensor and a method of operating the same in which the occurrence of a malfunction due to changed operating conditions may be prevented.

Furthermore, the present invention is directed to a capacitance measurement circuit capable of reducing the influence of a noise.

Technical Solution

One aspect of the present invention provides a touch sensor including: a pulse signal generator for generating a pulse signal of which pulse width is calibrated in response to a control code; a pulse signal transmitter for transmitting the pulse signal when a touch object is out of contact with a touch pad and stopping transmitting the pulse signal when the touch object is in contact with the touch pad; a pulse signal detector for detecting the pulse signal transmitted through the pulse signal transmitter; and a controller for recognizing a non-contact state and adjusting the control code to calibrate the pulse width of the pulse signal when the pulse signal detector detects the pulse signal.

In an embodiment of the present invention, the pulse signal transmitter may include: a resistor; and the touch pad charged or discharged with the pulse signal according to a resistance of the resistor and an electrostatic capacitance of the touch object to inhibit the transmission of the pulse signal.

In another embodiment, the pulse signal transmitter may include: a variable resistor of which a resistance varies with the control code; and the touch pad charged or discharged with the pulse signal according to the varied resistance of the variable resistor and the electrostatic capacitance of the touch object to inhibit the transmission of the pulse signal when the touch object is in contact with the touch sensor.

In an embodiment of the present invention, the pulse signal generator may include: a clock signal generator for generating a clock signal; and a counter of which a counting value is set according to the control code and counting by the counting value in response to the clock signal to vary the pulse width of the pulse signal.

In another embodiment, the pulse signal generator may include: a clock signal generator for generating a clock signal; a signal delay unit for varying the delay time of the clock signal according to the control code; an inverter for inverting an output signal of the signal delay unit; and a logic gate for performing a logic AND operation on the clock signal and an output signal of the inverter to generate the pulse signal having a pulse width corresponding to the delay time of the clock signal.

Another aspect of the present invention provides a method of operating a touch sensor. The method includes: generating a pulse signal having a predetermined pulse width; transmitting the pulse signal when a touch object is out of contact with a touch pad and stopping transmitting the pulse signal when the touch object is in contact with the touch pad; recognizing a non-contact state when the pulse signal is transmitted and recognizing a contact state when the pulse signal is not transmitted; and calibrating the pulse width of the pulse signal in the non-contact state.

In an embodiment of the present invention, calibrating the pulse width of the pulse signal in the non-contact state may include: obtaining a critical pulse width at which the pulse signal is not transmitted by gradually decreasing the pulse width of the pulse signal from the maximum value; obtaining a calibrated pulse width by adding a margin pulse width to the critical pulse width when a difference between the current critical pulse width and a critical pulse width obtained in the previous calibration operation is within the permitted limit; and calibrating the pulse width of the pulse signal to the calibrated pulse width.

In another embodiment of the present invention, calibrating the pulse width of the pulse signal in the non-contact state may include: obtaining a critical pulse width at which the pulse signal is not transmitted by gradually decreasing the pulse width of the pulse signal from the sum of a pulse width obtained in the previous calibration operation and the permitted limit; obtaining a calibrated pulse width by adding a margin pulse width to the critical pulse width when a difference between the current critical pulse width and a critical pulse width obtained in the previous calibration operation is within the permitted limit; and calibrating the pulse width of the pulse signal to the calibrated pulse width.

In yet another embodiment of the present invention, calibrating the pulse width of the pulse signal in the non-contact state may include: obtaining a critical pulse width at which the pulse signal is not transmitted by increasing and decreasing the pulse width of the pulse signal using a successive approximation method; obtaining a calibrated pulse width by adding a margin pulse width to the critical pulse width when a difference between the current critical pulse width and a critical pulse width obtained in the previous calibration operation is within the permitted limit; and calibrating the pulse width of the pulse signal to the calibrated pulse width.

Advantageous Effects

As described above, a touch sensor is capable of confirming if a touch object is in contact with a touch pad depending on whether a pulse signal is transmitted or not, so that the touch sensor can perform a touch sensing operation more precisely. Also, the pulse width of the pulse signal is periodically adjusted to operating conditions, thus preventing the occurrence of a malfunction in the touch sensor due to changing operating conditions. As a result, the operating reliability of the touch sensor can be enhanced.

MODE FOR INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

Figure 1:
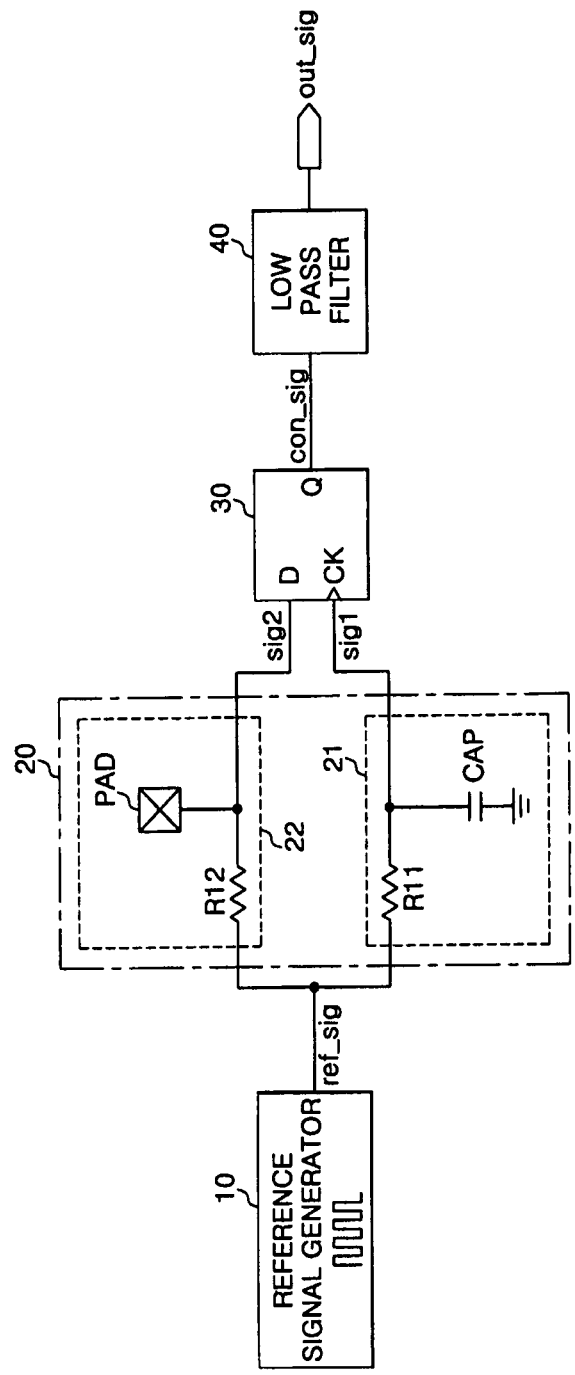
FIG. 1 is a detailed circuit diagram of a conventional touch sensor.
Figure 2:
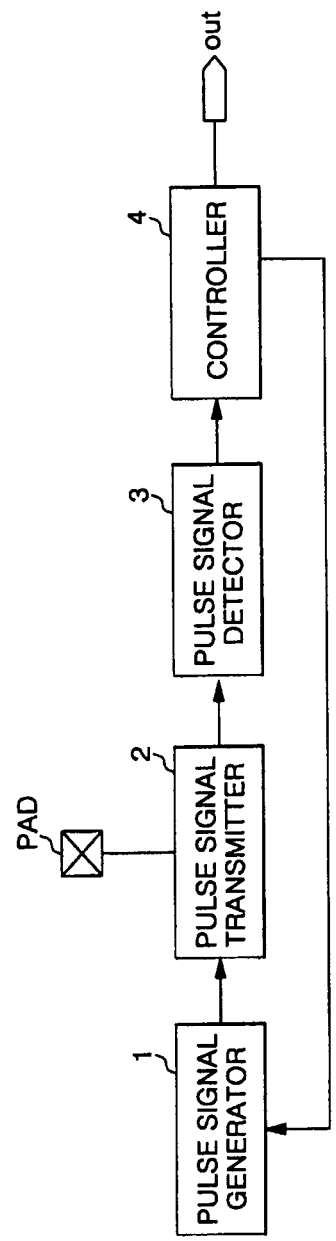
FIG. 2 is a block diagram of a touch sensor according to an exemplary embodiment of the present invention.

FIG. 2 is a block diagram of a touch sensor according to an exemplary embodiment of the present invention.

Referring to FIG. 2, the touch sensor may include a pulse signal generator 1, a pulse signal transmitter 2, a pulse signal detector 3, and a controller 4.

Specifically, the pulse signal generator 1 receives a code value of a control code "code" from the controller 4, sets the pulse width of a pulse signal "pul" according to the code value of the control code "code", and generates the pulse signal "pul" with the set pulse width.

The pulse transmitter 2 includes a touch pad PAD in which a touch object having a predetermined electrostatic capacitance contacts. The pulse transmitter 2 directly transmits the pulse signal "pul" to the pulse signal detector 3 when the touch object is out of contact with the touch pad PAD, while the pulse transmitter 2 transmits the pulse signal "pul" not to the pulse signal detector 3 but to the touch pad PAD when the touch object is in contact with the touch pad PAD.

In this case, the touch object may be any object having a predetermined electrostatic capacitance, for example, a human body in which a lot of charges may be accumulated.

The pulse signal detector 3 receives the pulse signal "pul" from the pulse signal transmitter 2, detects the pulse signal "pul", and transmits the detection result to the controller 4.

The controller 4 generates an output signal "out" based on the detection result of the pulse signal detector 3 and outputs the output signal "out" to an external apparatus, so that the external apparatus can be informed of whether the touch object is in contact with the touch pad PAD or not. Also, the controller 4 periodically performs a calibration operation such that the pulse width of the pulse signal "pul" is adjustable to the current operating conditions in a non-contact state.

In FIG. 2, the impedance of a circuit device included in each of the pulse signal generator 1 and the pulse signal transmitter 2 of the touch sensor and the touch sensitivity of the touch pad PAD may vary with operating conditions, such as an operating power supply voltage and the temperature and humidity of the atmosphere. Thus, the range of the pulse width in which the pulse signal detector 3 can detect the pulse signal "pul" transmitted by the pulse signal transmitter 2 also varies with the operating conditions of the touch sensor.

Therefore, the controller 4 of the present invention varies the pulse width of the pulse signal according to the operating conditions so that the pulse signal detector 3 can always precisely detect the pulse signal "pul" transmitted by the pulse signal transmitter 2, thus preventing the occurrence of a malfunction in the touch sensor due to variable operating conditions.

Figure 3:
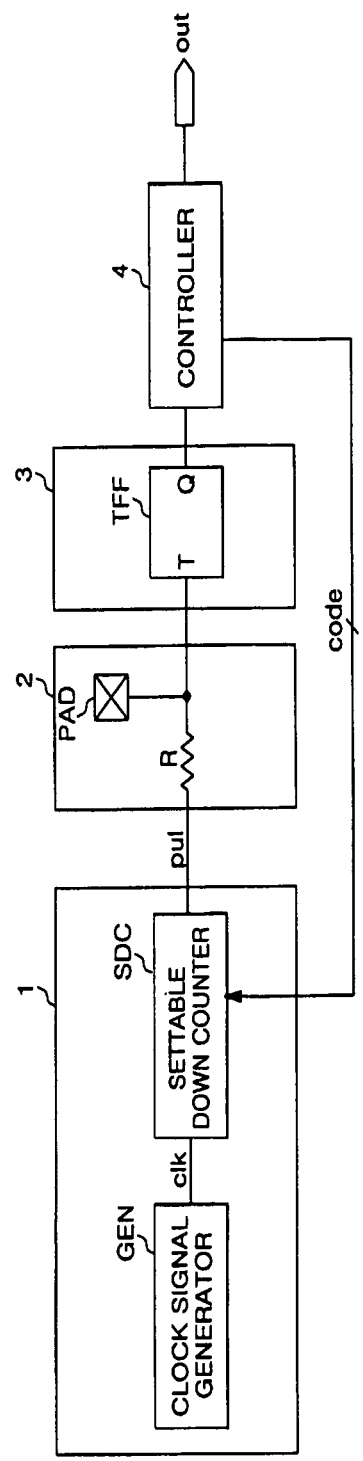
FIG. 3 is a detailed circuit diagram of a touch sensor according to an exemplary embodiment of the present invention.

FIG. 3 is a detailed circuit diagram of a touch sensor according to an exemplary embodiment of the present invention.

Referring to FIG. 3, the pulse signal generator 1 may include a clock signal generator GEN and a settable down counter SDC, the pulse signal transmitter 2 includes a resistor R and a touch pad PAD, and the pulse signal detector 3 is embodied by a T-flip-flop TFF.

The clock signal generator GEN generates a clock signal "clk" and transmits the clock signal "clk" to the settable down counter SDC.

The settable down counter SDC generates a pulse signal "pul" of which pulse width varies according to a code value of a control code "code" transmitted from the controller 4. Specifically, the settable down counter SDC of which a count value is set according to the code value of the control code "code", leads the pulse signal "pul" to make an upward (downward) transition at the start of a counting operation, and leads the pulse signal "pul" to make a downward (upward) transition at the end of the counting operation, so that the pulse width of the pulse signal "pul" may vary with the code value of the control code "code".

The resistor R has a predetermined resistance and obtains the electrostatic capacitance of a touch object that is in contact with the touch pad PAD. Thus, when the touch object is in contact with the touch pad PAD, the resistor R and the touch pad PAD are charged or discharged with the pulse signal "pul" according to the resistance of the resistor R and the electrostatic capacitance of the touch object, and the transmission of the pulse signal "pul" to the T-flip-flop TFF is inhibited. On the other hand, when the touch object is out of contact with the touch pad PAD, the resistor R and the touch pad PAD are neither charged nor discharged with the pulse signal "pul", and the pulse signal "pul" is transmitted to the T-flip-flop TFF.

When receiving the pulse signal "pul", the T-flip-flop TFF is synchronized with a rising edge or falling edge of the pulse signal "pul" and toggles an output signal. When receiving no pulse signal "pul", the T-flip-flop TFF does not toggle the output signal.

When the T-flip-flop TFF outputs the toggled output signal, the controller 4 externally outputs an output signal "out" for informing a user of non-contact of the touch object with the touch pad PAD. When the T-flip-flop TFF does not output the toggled output signal, the controller 4 externally outputs an output signal "out" for informing the user of contact of touch object with the touch pad PAD.

As described above, the touch sensor of FIG. 3 allows or inhibits the transmission of the pulse signal "pul" depending on whether the touch object contacts the touch pad PAD, so that a user can easily and precisely confirm the contact or non-contact of the touch object with the touch pad PAD.

Figure 4:
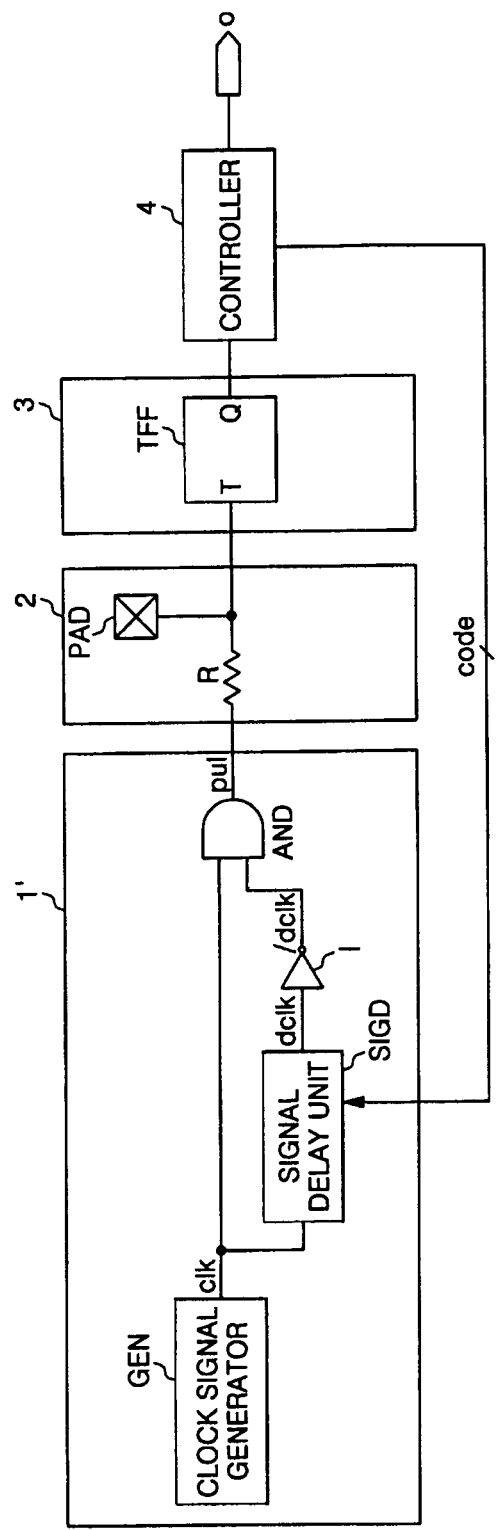
FIG. 4 is a detailed circuit diagram of a touch sensor according to another exemplary embodiment of the present invention.

FIG. 4 is a detailed circuit diagram of a touch sensor according to another exemplary embodiment of the present invention.

Referring to FIG. 4, a pulse signal transmitter 2, a pulse signal detector 3, and a controller 4 are respectively the same as those of FIG. 3, but a pulse signal generator 1' includes a clock signal generator GEN, a signal delay unit SIGD, an inverter I, and an AND gate AND, unlike FIG. 3.

In FIG. 4, the same reference numerals are used to denote the same elements as in FIG. 3 and thus, a detailed description of the same elements will be omitted here.

The clock signal generator GEN generates a clock signal "clk" and transmits the clock signal "clk" to each of the signal delay unit SIGD and the AND gate AND.

The signal delay unit SIGD varies the delay time of the clock signal "clk" in response to a code value of a control code "code" transmitted from the controller 4.

The inverter I receives a delayed clock signal "dclk" from the signal delay unit SIGD, inverts the delayed clock signal "dclk", and outputs an inverted clock signal "/dclk".

The AND gate AND performs a logic AND operation on the clock signal "clk" transmitted from the clock signal generator GEN and the clock signal "/dclk" output from the inverter I and generates a pulse signal "pul" having a pulse width corresponding to the delay time of the signal delay unit SIGD.

Figure 5:
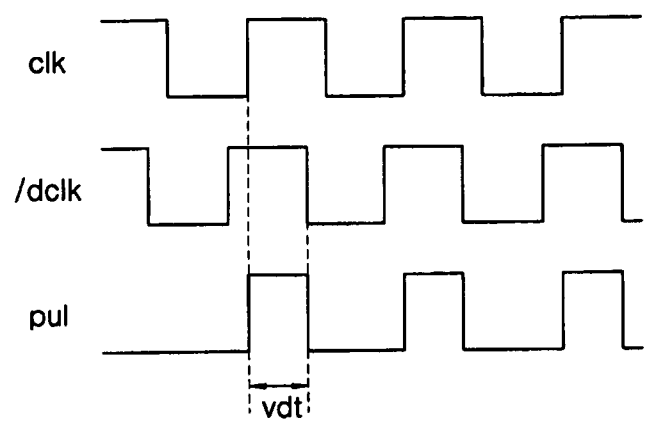
FIG. 5 shows a correlation between the delay time of a signal delay unit of FIG. 4 and the pulse width of a pulse signal.

For example, as illustrated in FIG. 5, when the delay time of the signal delay unit SIGD is "vdt", the delay time of the clock signal "/dclk" transmitted through the signal delay unit SIGD and the inverter I also becomes "vdt". Thus, the AND gate AND performs a logic AND operation on the clock signals "clk" and "/dclk" and generates a pulse signal "pul" having a pulse width corresponding to the delay time "vdt" of the signal delay unit SIGD.

As described above, in the touch sensor of FIG. 4, the pulse signal generator 1', which includes the clock signal generator GEN, the signal delay unit SIGD, the inverter I, and the AND gate AND, generates the pulse signal "pul" of which pulse width varies with the code value of the control code "code", so that the pulse signal transmitter 2, the pulse signal detector 3, and the controller 4 can operate in the same manner as described with reference to FIG. 3.

Figure 6:
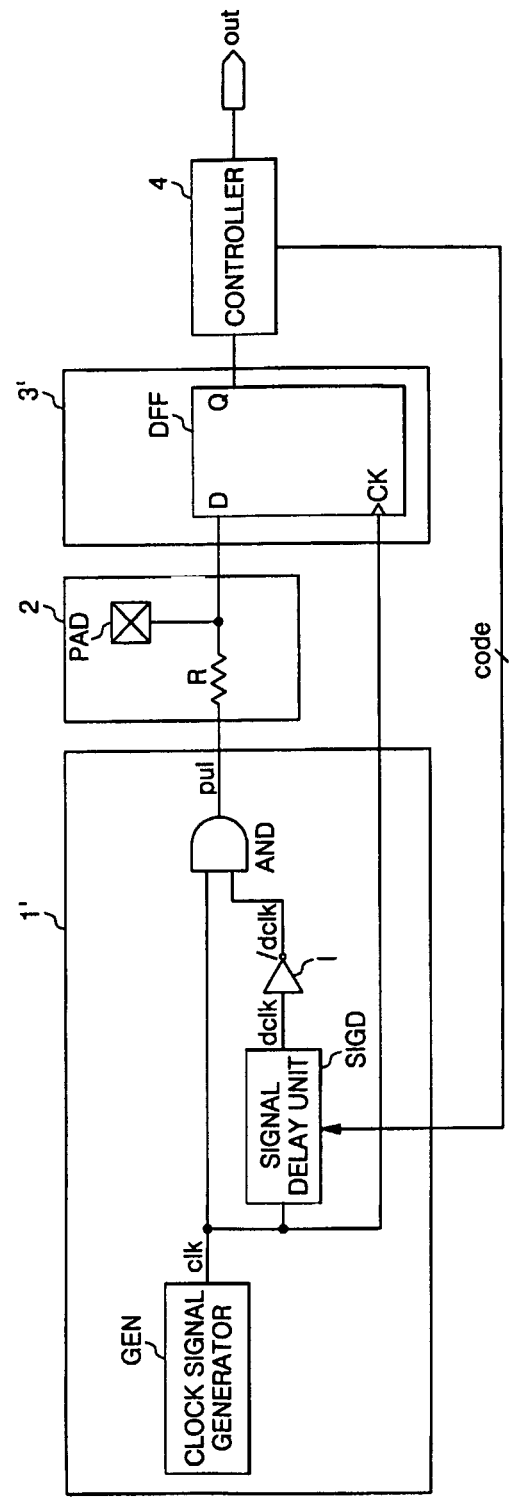
FIG. 6 is a detailed circuit diagram of a touch sensor according to yet another exemplary embodiment of the present invention.

FIG. 6 is a detailed circuit diagram of a touch sensor according to yet another exemplary embodiment of the present invention.

Referring to FIG. 6, a pulse signal generator 1' and a pulse signal transmitter 2 are respectively the same as those of FIG. 4, but a pulse signal detector 3' is embodied by a D-flip-flop DFF.

In FIG. 6, the same reference numerals are used to denote the same elements as in FIG. 4 and thus, a detailed description of the same elements will be omitted here.

The D-flip-flop DFF receives a clock signal "clk" output from a clock signal generator GEN as a clock, and receives a pulse signal "pul" as data. When receiving the pulse signal "pul", the D-flip-flop DFF is synchronized with a falling edge (or rising edge) of the clock signal "clk", latches the pulse signal "pul", and generates a high signal. When receiving no pulse signal "pul", the D-flip-flop DFF does not latch any signal and generates a low signal.

Thus, a controller 4 confirms non-contact of a touch object with a touch pad PAD when the D-flip-flop DFF generates the high signal, and confirms contact of the touch object with the touch pad PAD when the D-flip-flop DFF generates the low signal.

As described above, in the touch sensor of FIG. 6, the D-flip-flop DFF may vary the level of the output signal depending on whether or not the touch object contacts the touch pad PAD, so that the controller 4 can easily confirm the contact or non-contact of the touch object with the touch pad PAD.

Figure 7:
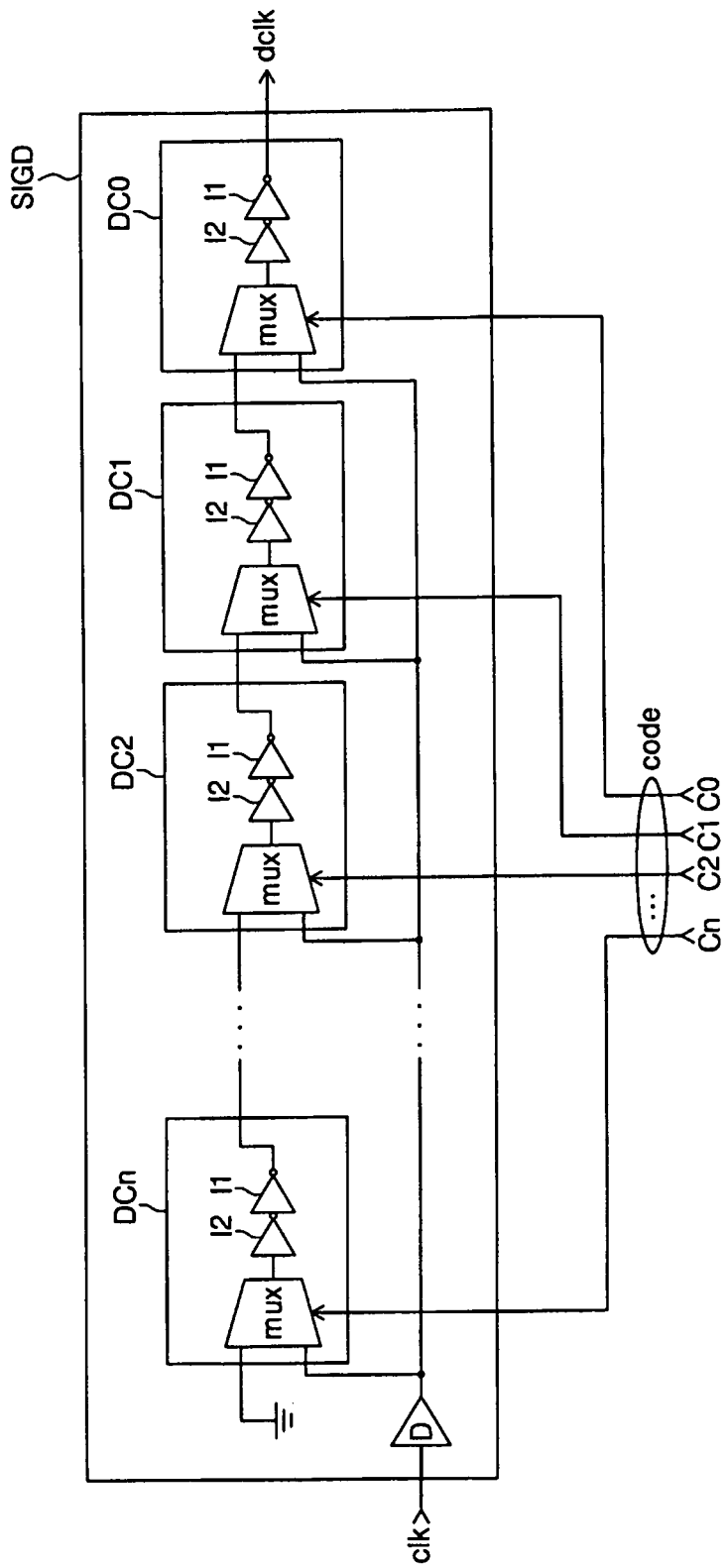
FIG. 7 is a detailed circuit diagram of a signal delay unit SIGD according to an exemplary embodiment of the present invention.

FIG. 7 is a detailed circuit diagram of a signal delay unit SIGD according to an exemplary embodiment of the present invention.

Referring to FIG. 7, the signal delay unit SIGD includes a driver D, which is connected to a signal input terminal "clk", and a plurality of delay cells DC1 to DCn, which are connected in series between the driver D and a signal output terminal "dclk", and each of the delay cells DC1 to DCn includes a multiplexer "mux" and inverters I1 and I2.

The driver D buffers a clock signal "clk" and transmits the buffered signal to the delay cells DC1 to DCn.

The multiplexers "mux" select the delay cells (e.g., the delay cells DC2 to DC0) to perform delay operations in response to code values c0 to cn of a control code "code", and the multiplexers "mux" and the inverters I1 and I2 included in the selected delay cells DC2 and DC0 delay the clock signal "clk" by a predetermined delay time.

As described above, the signal delay unit SIGD varies the number of delay cells to delay the clock signal "clk" according to the code value of the control code "code" and varies the delay time of the clock signal "clk", so that the inverter I and an AND gate AND can generate a pulse signal "pul" having a pulse width corresponding to the delay time of the clock signal "clk".

Figure 8:
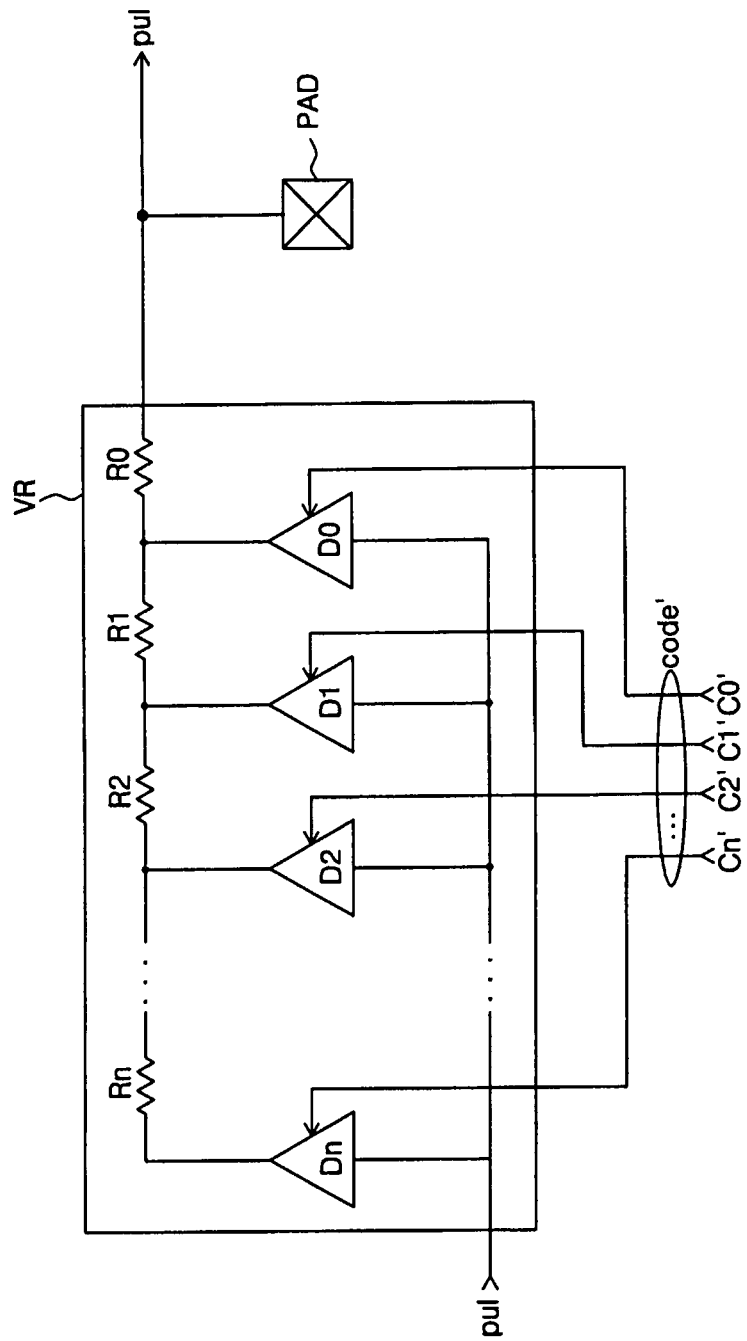
FIG. 8 is a circuit diagram of a pulse signal transmitter according to another exemplary embodiment of the present invention.

Also, the touch sensor according to the present invention may employ a variable resistor of FIG. 8 instead of the resistor R included in the pulse signal transmitter 2, so that the controller 4 can control the resistance of the variable resistor to vary the touch sensitivity of the touch pad PAD.

FIG. 8 is a circuit diagram of a pulse signal transmitter according to another exemplary embodiment of the present invention.

Referring to FIG. 8, the pulse signal transmitter includes a variable resistor VR and a touch pad PAD. The variable resistor VR includes a plurality of drivers D0 to Dn, which are respectively connected between a pulse input terminal "pul" and a plurality of corresponding resistors R0 to Rn, and the plurality of resistors R0 to Rn are connected in series to the touch pad PAD.

In this case, a controller (not shown) further provides a control code "code" for controlling the resistance of the variable resistor VR in addition to a control code "code" for varying the pulse width of the pulse signal "pul" during a calibration operation.

Thus, the variable resistor VR determines the number of resistors to which the pulse signal "pul" is transmitted through the drivers D0 to Dn, of which operations are controlled in response to code values c0' to cn' of the control code code'. In other words, the variable resistor VR varies the entire resistance according to the code value of the control code code' and also varies an RC time constant with the electrostatic capacitance of the touch pad PAD.

Thus, charging/discharging characteristics of the touch pad PAD vary with the RC time constant, which is varied by the variable resistor VR, and the touch sensitivity of the touch pad PAD finally depends on the varied charging/discharging characteristics thereof.

Therefore, the pulse signal transmitter of FIG. 8 may vary the touch sensitivity of the touch pad PAD according to the code value of the control code code' transmitted from the controller 4.

As described above, the touch sensor according to the present invention may vary not only the pulse width of the pulse signal "pul" but also the touch sensitivity of the touch pad PAD to the touch object according to the current operating conditions, thus enhancing the preciseness of a calibration operation.

Figure 9:
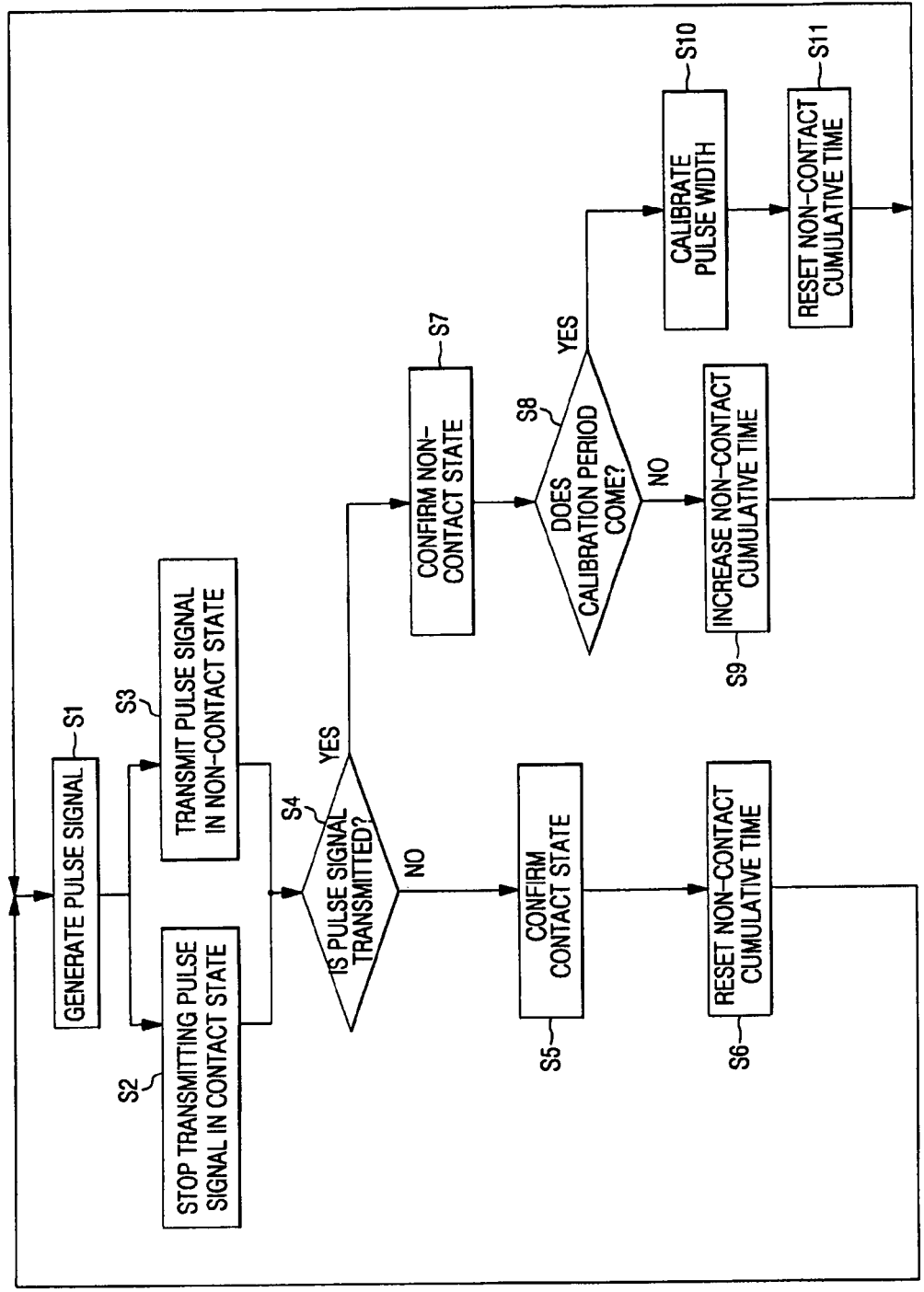
FIG. 9 is a flowchart illustrating a method of operating a touch sensor according to an exemplary embodiment of the present invention.

FIG. 9 is a flowchart illustrating a method of operating a touch sensor according to an exemplary embodiment of the present invention.

When the touch sensor starts its operation, the pulse signal generator 1 generates a pulse signal "pul" having a predetermined pulse width and outputs the pulse signal "pul" to the pulse signal transmitter 2 in step S1.

When a touch object is brought into contact with a touch pad PAD, the pulse signal transmitter 2 stops the transmission of the pulse signal "pul" in step S2. When the touch object is out of contact with the touch pad PAD, the pulse signal transmitter 2 transmits the pulse signal "pul" to the pulse signal detector 3 in step S3.

Then, the controller 4 confirms if the pulse signal "pul" is transmitted through the pulse signal detector 3 in step S4. As a result, when the pulse signal "pul" is not transmitted, the controller 4 informs a user or an external apparatus that the touch object contacts the touch pad PAD in step S5. Thereafter, the controller 4 resets a "non-contact cumulative time" in step S6 and returns to step S1 to perform a new touch sensing operation.

On the other hand, when it is confirmed in step S4 that the pulse signal "pul" is transmitted, the controller 4 informs the external apparatus that the touch object is out of contact with the touch pad PAD in step S7 and confirms if a calibration period comes in step S8.

As a result, when it is confirmed in step S8 that the calibration period has not come yet, the controller 4 increases the current "non-contact cumulative time" as much as one unit in step S9 and returns to step S1 to perform a new touch sensing operation.

On the other hand, when it is confirmed in step S8 that the calibration period has come, the controller 4 performs a calibration operation such that the pulse width of the pulse signal "pul" is adjustable to the current operating conditions in step S10. The calibration of the pulse signal "pul" in step S10 will be described in more detail with reference to FIGS. 10 through 12.

When step 10 is finished, the controller 4 resets the current "non-contact cumulative time" and returns to step S1 to perform a new touch sensing operation using the pulse signal "pul" having a calibrated pulse width.

Figure 10:
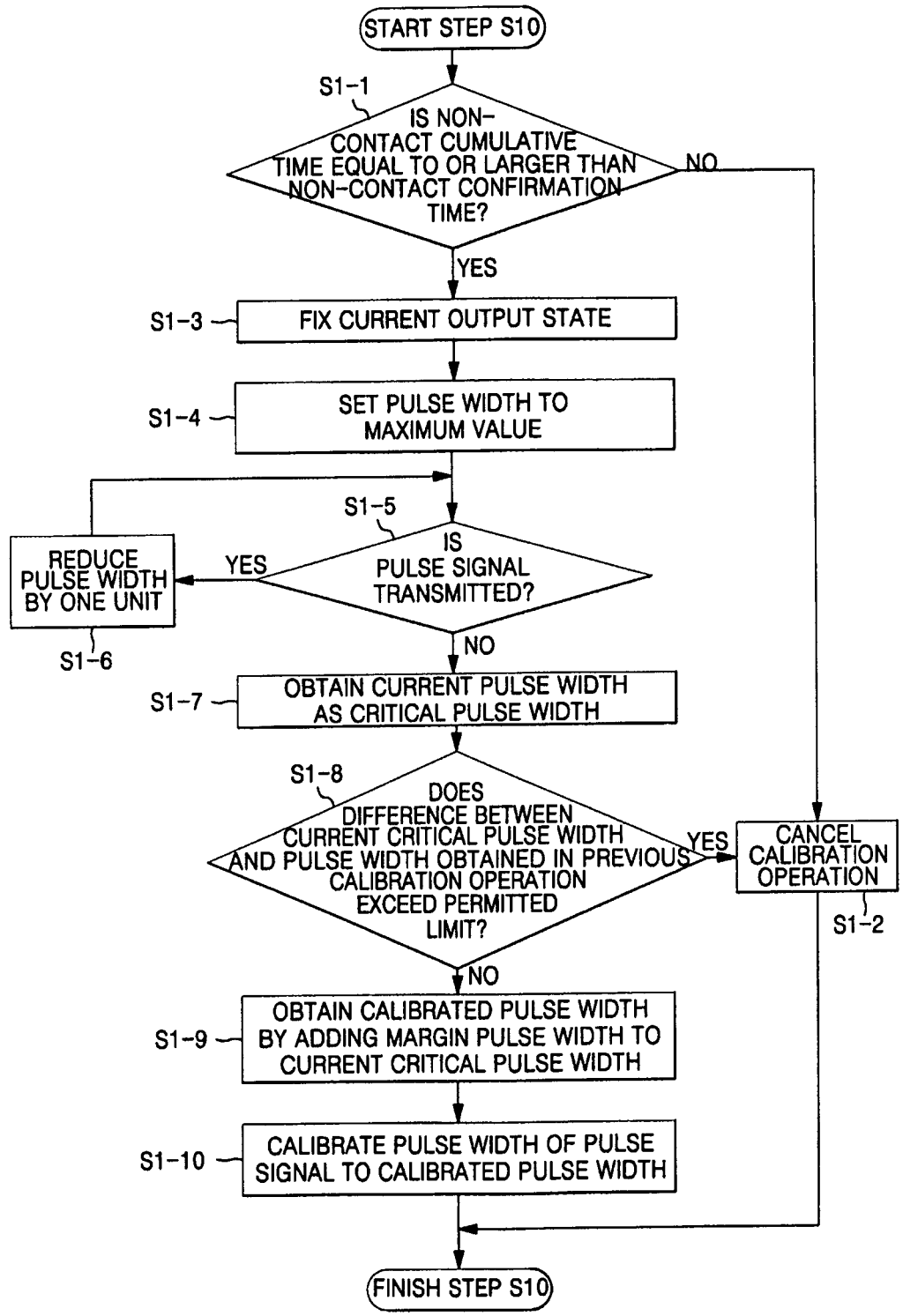
FIG. 10 is a flowchart illustrating a calibration operation (step S10) of FIG. 9 according to an exemplary embodiment of the present invention.

FIG. 10 is a flowchart illustrating a calibration operation (step S10) of FIG. 9. In FIG. 10, a pulse width appropriate for the current operating conditions may be obtained by gradually decreasing the pulse width of the pulse signal "pul" from the maximum value.

First, the controller 4 confirms if a "non-contact cumulative time" is equal to or larger than a "non-contact confirmation time" in step S1-1 in order to confirm if the current operating conditions are conditions under which the calibration of a pulse signal "pul" is normally performed (namely, if the touch object is out of contact with the touch pad PAD).

When the "non-contact cumulative time" is less than "the non-contact confirmation time", the controller 4 confirms that the touch object is in contact with the touch pad PAD and cancels the calibration operation in step S1-2 and ends the control sequence.

On the other hand, when the "non-contact cumulative time" is equal to or larger than the "non-contact confirmation time", the controller 4 confirms that the touch object is out of contact with the touch pad for a predetermined duration of time, and fixes the current output state in step S1-3 such that any malfunction does not occur in an external apparatus due to an output signal of the touch sensor during the calibration operation.

Thereafter, the controller 4 sets the pulse width of the pulse signal "pul" to the maximum value in step S1-4 and confirms if the pulse signal "pul" is transmitted through the pulse signal transmitter 2 to the controller 4 in step S1-5.

When the pulse signal "pul" is transmitted, the pulse width of the pulse signal "pul" is reduced by one unit in step S1-6 and the controller 4 returns to step S1-5. Thus, the pulse width of the pulse signal "pul" is gradually reduced until the pulse signal "pul" is not transmitted.

When the pulse signal "pul" is not transmitted, the controller 4 obtains the current pulse width as a critical pulse width in step S1-7 and confirms if a difference between the current critical pulse width and a critical pulse width obtained in the previous calibration operation exceeds a permitted limit in step S1-8. Here, the permitted limit is a value that can be determined by a user to confirm if the calibration of the pulse signal "pul" is normally performed.

When the difference between the current critical pulse width and the critical pulse width obtained in the previous calibration operation exceeds the permitted limit, the controller 4 confirms that the calibration condition is not satisfied and cancels the calibration operation in step S1-2 and ends the control sequence.

On the other hand, when the difference between the current critical pulse width and the critical pulse width obtained in the previous calibration operation is within the permitted limit, the controller 4 confirms that the calibration operation is performed under normal conditions and obtains a calibrated pulse width appropriate for the current operating conditions in step S1-9 by adding a margin pulse width to the current critical pulse width. Here, the margin pulse width is a value that can be set by a user based on the touch sensitivity of the touch pad PAD. Thus, the calibrated pulse width becomes the minimum pulse width that enables the pulse signal detector 3 to detect if the pulse signal "pul" is transmitted under the current operating conditions.

Thereafter, the controller 4 calibrates the pulse signal "pul" to the calibrated pulse width in step S1-10, ends the calibration operation, and enters step S11 of FIG. 9.

Figure 11:
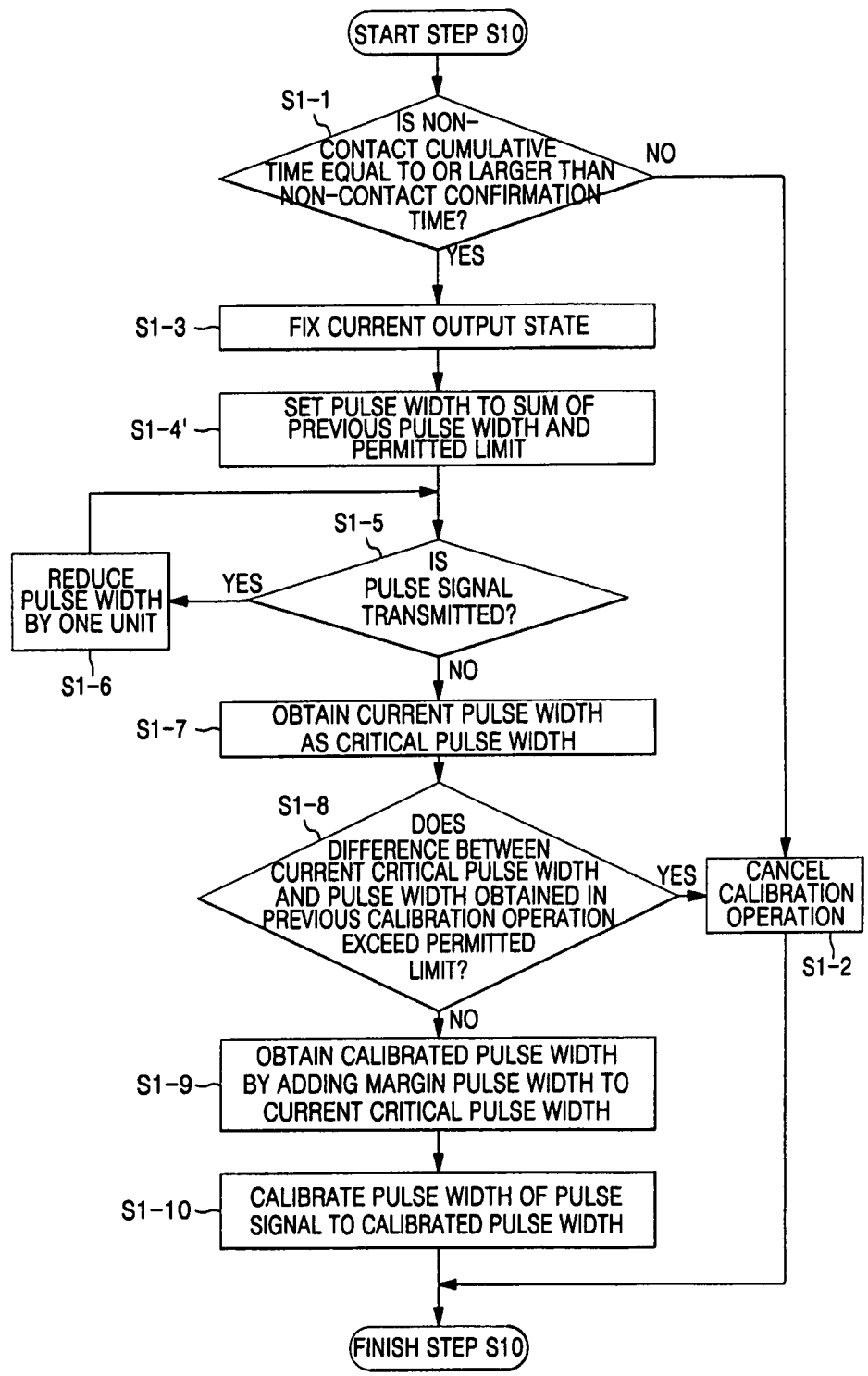
FIG. 11 is a flowchart illustrating a calibration operation (step S10) of FIG. 9 according to another exemplary embodiment of the present invention.

FIG. 11 is a flowchart illustrating a calibration operation (step S10) of FIG. 9 according to another exemplary embodiment of the present invention.

In FIG. 11, a pulse width appropriate for the current operating conditions may be obtained by gradually decreasing the pulse width of the pulse signal "pul" from the sum of the pulse width obtained in the previous calibration operation and the permitted limit.

In other words, the controller 4 sets the pulse width of the pulse signal "pul" to the sum of the pulse width obtained in the previous calibration operation and the permitted limit in step S1-4', unlike in step S1-4 of FIG. 10. Thereafter, the pulse width of the pulse signal "pul" is gradually reduced in steps S1-5 and S1-6.

As described above, the calibration operation of FIG. 11 aims to obtain the calibrated pulse width appropriate for the current operating conditions like the calibration operation of FIG. 10, but the searchable range of the pulse width is restricted to accelerate the calibration operation.

Figure 12:
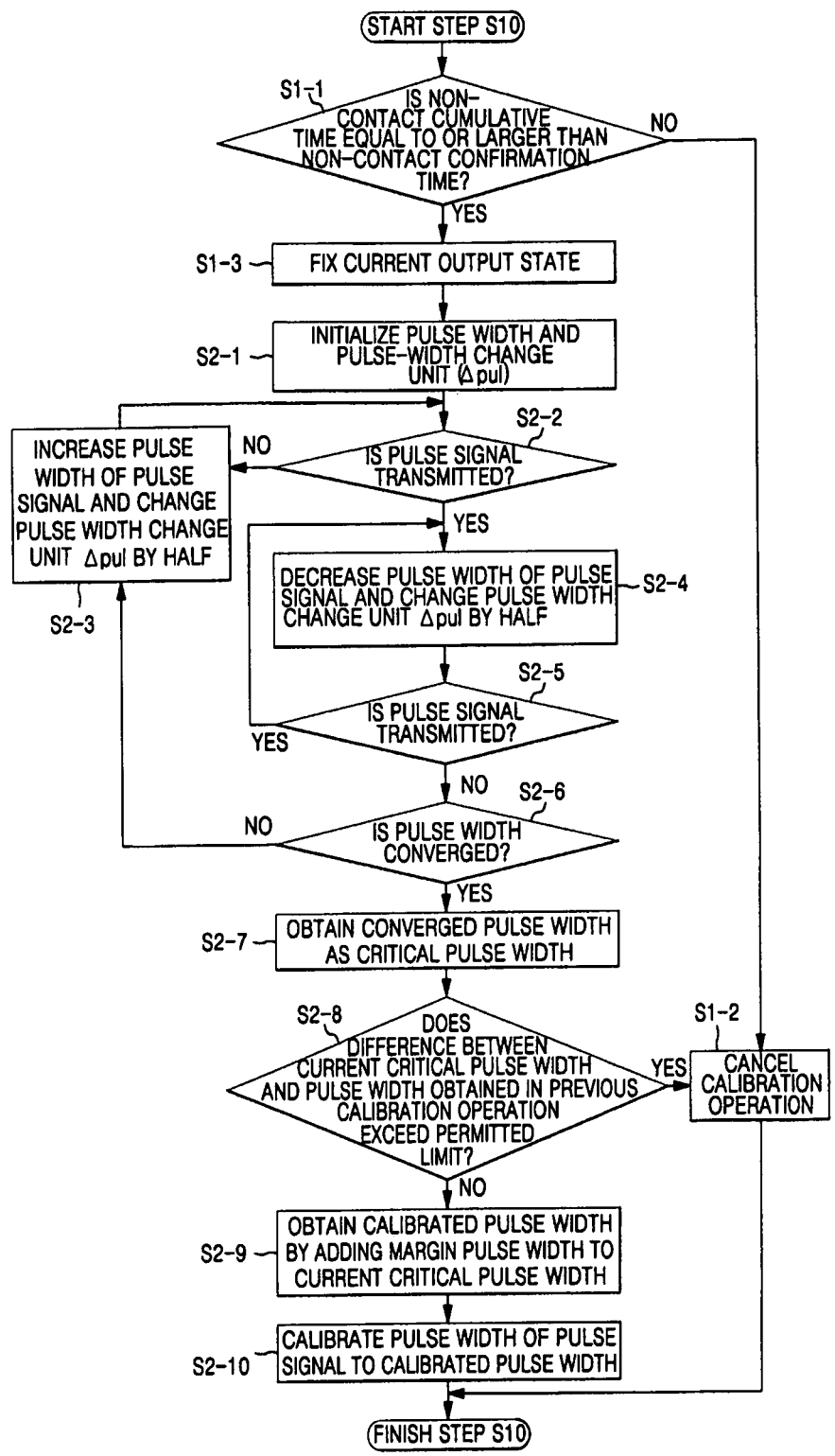
FIG. 12 is a flowchart illustrating a calibration operation (step S10) of FIG. 9 according to yet another exemplary embodiment of the present invention.

FIG. 12 is a flowchart illustrating a calibration operation (step S10) of FIG. 9 according to yet another exemplary embodiment of the present invention In FIG. 12, a pulse width appropriate for the current operating conditions may be obtained using a successive approximation method, which is being widely adopted in the analog-to-digital converter (ADC) field.

First, the controller 4 performs the same operations as in steps S1-1 to S1-3 of FIG. 10. Thereafter, the pulse width of the pulse signal "pul" is set to a half "mid" of the maximum value "max", and a pulse-width change unit $\Delta$pul is set to an intermediate value between the half-maximum value "mid" and the maximum value "max" in step S2-1.

When the pulse signal "pul" is not transmitted in step S2-2, the controller 4 increases the pulse width of the pulse signal "pul" by pulse-width change unit Apul and makes the pulse-width change unit $\Delta$pul by half in step S2-3 and returns to step S2-2 again. That is, the controller 4 repeats steps S2-2 and S2-3 until the pulse signal "pul" is transmitted to the controller 4 so that the pulse width of the pulse signal "pul" is gradually increased while increasing.

As a result, when the pulse signal "pul" is finally transmitted in step S2-2, the controller 4 reduces the pulse width of the pulse signal "pul" by the preset pulse-width change unit $\Delta$pul and makes the pulse-width change unit $\Delta$pul by half in step S2-4 and confirms if the pulse signal "pul" is transmitted in step S2-5. That is, the controller 4 repeats steps S2-4 and S2-5 until the pulse signal "pul" is not transmitted to the controller 4 so that the pulse width of the pulse signal "pul" is gradually decreased.

Figure 13:
FIG. 13 is a graph illustrating a method of finding a critical pulse width in the calibration operation of FIG. 12.

The controller 4 repeats steps S2-2 and S2-5 several times until the pulse width of the pulse signal "pul" is converged to a specific value in step S2-6, as shown in FIG. 13. Thus, when the pulse width of the pulse signal "pul" is converged to the specific value, the controller 4 obtains the specific value as a critical pulse width in step S2-7.

In step S2-6, the pulse width is converged to the specific value by repeating a process of gradually increasing the pulse width through steps S2-2 and S2-3, as shown in FIG. 13, and a process of gradually decreasing the pulse width through steps S2-4 and S2-5.

The controller 4 confirms if a difference between the current critical pulse width and the critical pulse width obtained in the previous calibration operation exceeds a permitted limit in step S2-8. When the difference between the current critical pulse width and the critical pulse width obtained in the previous calibration operation exceeds the permitted limit, the controller 4 confirms that the calibration is not satisfied and cancels the calibration operation in step S1-2 and ends the control sequence.

On the other hand, when the difference between the current critical pulse width and the critical pulse width obtained in the previous calibration operation is within the permitted limit, the controller 4 confirms that the calibration operation is performed under normal conditions and obtains a calibrated pulse width appropriate for the current operating conditions in step S2-6 by adding a margin pulse width to the current critical pulse width.

Thereafter, the controller 4 calibrates the pulse signal "pul" to the calibrated pulse width in step S2-7, ends the calibration operation, and enters step S11 of FIG. 9.

As described above, the calibration operation of FIG. 12 aims to obtain a calibrated pulse width appropriate for the current operating conditions and calibrate the pulse width of the pulse signal "pul", like the calibration operation of FIG. 10. It is natural that the decision step whether or not the pulse signal is transmitted can be done by a sequence way such as, not limited, a train of the same pulse width.

The touch sensor senses only the contact or non-contact of the touch object and output an output signal but does not output a capacitance of the touch object. However, in some cases, the touch sensor not only senses the contact or non-contact of the touch object with the touch pad PAD but also may have to measure the capacitance in order to measure the intensity of the contact. Also, a portable device including the touch sensor may be affected by frequent environmental changes due to its characteristics. Thus, the touch sensor should be configured to lessen the influence of various noises caused by the environmental changes in order to inhibit malfunction from occurring in the portable device due to the noises.

Figure 14:
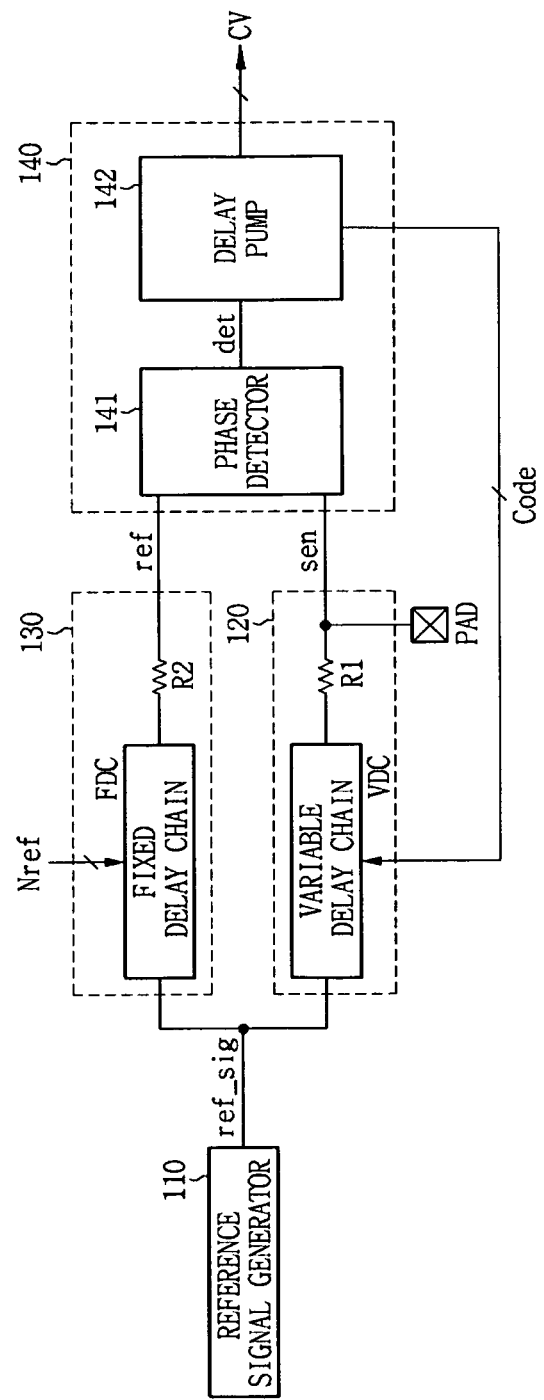
FIG. 14 is a circuit diagram of a capacitance measurement circuit configured to sense a contact state according to an exemplary embodiment of the present invention.

FIG. 14 is a circuit diagram of a capacitance measurement circuit configured to sense a contact state according to an exemplary embodiment of the present invention.

The capacitance measurement circuit of FIG. 14 includes a reference signal generator 110, a variable delay unit 130, a fixed delay unit 130, and a delay time calculator/data generator 140. The reference signal generator 110 may be embodied by a clock generation circuit configured to generate a clock signal having a predetermined period as a reference signal ref_sig.

The variable delay unit 120 includes a variable delay chain VDC and a resistor R1, which are connected in series between the reference signal generator 110 and the delay time calculator/data generator 140. Also, the variable delay unit 120 includes a pad PAD connected between the resistor R1 and the delay time calculator/data generator 140 and configured to externally receive a capacitance value. The variable delay chain VDC variably delays and outputs the reference signal ref_sig in response to a code value Code fed back and applied by a delay pump 142. The resistor R1 and the pad PAD receive the variably delayed reference signal ref_sig from the variable delay chain VDC, delay the variably delayed reference signal ref_sig according to the resistance of the resistor R1 and the capacitance value applied through the pad PAD, and output a sensing signal "sen" to the delay time calculator/data generator 140.

The fixed delay unit 130 includes a fixed delay chain FDC and a resistor R2, which are connected in series between the reference signal generator 110 and the delay time calculator/data generator 140 in parallel to the variable delay unit 120. The fixed delay chain FDC receives a reference delay value Nref required for controlling a zero point of a code value Code applied to the variable delay chain VDC in order to compensate for an offset capacitance of the pad PAD and maximize a measurement range of the capacitance value. The fixed delay chain FDC delays the reference signal ref_sig in response to the reference delay value Nref and outputs the delayed reference signal ref_sig. The resistor R2 further delays the delayed reference signal ref_sig output by the fixed delay chain FDC and outputs a fixed reference signal "ref" to the delay time calculator/data generator 140.

Each of the fixed delay chain FDC and the variable delay chain VDC may include a plurality of delay cells like the signal delay unit SIGD of FIG. 7. Each of the plurality of delay cells may include a single multiplexer MUX and two inverters. The fixed delay chain FDC selects delay cells configured to delay the reference signal ref_sig in response to the reference delay value Nref, and the variable delay chain VDC selects delay cells configured to delay the reference signal ref_sig in response to the code value Code.

The delay time calculator/data generator 140 includes a phase detector 141 and the delay pump 142. The phase detector 141 determines whether the phase of the sensing signal "sen" leads or trails that of the fixed reference signal "ref" and outputs a detection signal "det". The delay pump calculates a capacitance value CV in response to the detection signal "det" and ups or downs and outputs the code value Code in response to the calculated capacitance value CV.

In the capacitance measurement circuit of FIG. 14, each of the variable delay chain VDC and the fixed delay chain FDC of the variable delay unit 120 and the fixed delay unit 130 directly receives the reference signal ref_sig from the reference signal generator 110. Thus, since the pad PAD configured to externally receive the capacitance is interposed between the variable delay chain VDC configured to receive the fed-back capacitance value CV and the delay time calculator/data generator 140 configured to output the capacitance value CV, the pad PAD is disposed within a feedback loop.

Although noises may occur in the capacitance measurement circuit, there are frequent cases where external noises are applied through the pad PAD. Thus, it is most efficient to remove the external noises applied through the pad PAD in order to reduce the noises. Also, in the capacitance measurement circuit of FIG. 14, the pad PAD through which a capacitance is externally applied is connected to the inside of a feedback loop. When the pad PAD is connected to the inside of the feedback loop, the noises may be attenuated due to the characteristics of the feedback loop.

Figure 15:
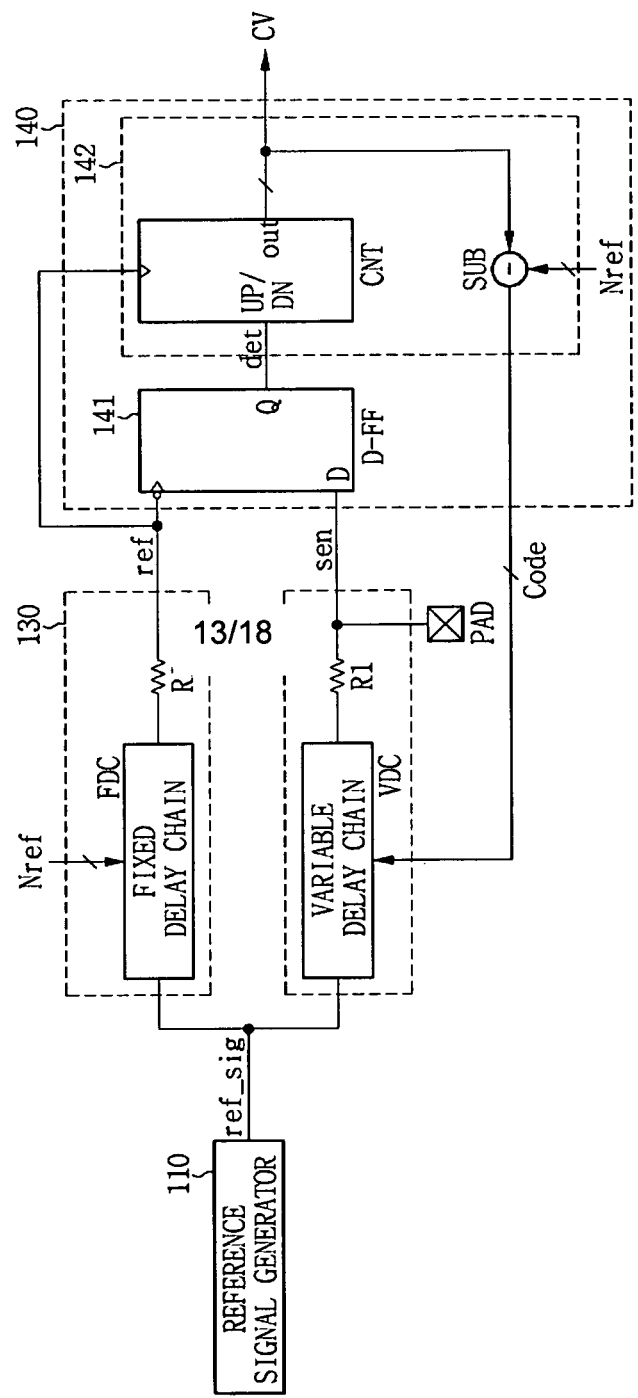
FIG. 15 is a circuit diagram of the capacitance measurement circuit including a delay time calculator/data generator of FIG. 14.

FIG. 15 is a circuit diagram of the capacitance measurement circuit having the delay time calculator/data generator of FIG. 14. Since a reference signal generator 110, a variable delay unit 120, and a fixed delay unit 130 of FIG. 15 are the same as in FIG. 14, a description thereof will be omitted here.

In a delay time calculator/data generator 140 of FIG. 15, a phase detector 141 is embodied by a D-flip-flop DFF, and a delay pump 142 includes a counter CNT and a subtracter "sub". The D-flip-flop DFF latches a sensing signal "sen" in synchronization with one of rising and falling edges of a fixed reference signal "ref" and outputs the latched sensing signal "sen". The D-flip-flop DFF outputs a low-level detection signal "det" when the sensing signal "sen" is not delayed with respect to the fixed reference signal "ref", and outputs a high-level detection signal "det" when the sensing signal "sen" is delayed with respect to the fixed reference signal "ref". The delay pump 142 increases a code value Code when the detection signal "det" drops to a low level, and decreases the code value Code when the detection signal "det" rises to a high level. In other words, the delay pump 142 performs a negative feedback function and controls such that the phase of the sensing signal "sen" output by the variable delay unit 120 is equal to that of the fixed reference signal "ref" output by the fixed delay unit 130. A delay offset may occur due to the pad PAD between the fixed delay unit 130 and the variable delay unit 120. When the delay offset exceeds a control range of a variable delay chain VDC, the capacitance measurement circuit of FIG. 15 departs from a normal operation range. In this case, a reference delay value Nref of the fixed delay unit 130 compensates for an offset capacitance so that the code value Code of the variable delay chain can be within a variable delay range. Although FIG. 15 shows the D-flip-flop DFF as an example of the phase detector 141, it is natural that the phase detector 141 can be embodied by another logic circuit.

The counter CNT is an up/down counter configured to up or down and output the capacitance value CV in response to the detection signal "det". The counter CNT may up or down the capacitance value CV by one bit according to the level of the detection signal "det". In this case, however, when a large capacitance is applied through the pad PAD, a long time is taken to measure the capacitance. In order to solve this problem, the counter CNT does not up or down the capacitance value CV by one bit but may up or down and output the capacitance value CV in proportion to multipliers of 2, that is, in the order of one bit, two bits, four bits, and eight bits, in response to continuous application of high-level or low-level detection signals "det". Alternatively, the counter CNT may up and down the capacitance value CV according to predetermined rules in response to the continuous application of high-level or high-level detection signals "det". Although it is illustrated that the counter CNT receives the detection signal "det" in response to the fixed reference signal "ref", the counter CNT may receive the detection signal "det" in response to the reference signal ref_sig.

The subtracter "sub" subtracts the capacitance value CV from the reference delay value Nref and outputs the code value Code. Thus, the capacitance value CV refers to a total capacitance value applied to the pad PAD. When the capacitance value applied to the pad PAD is increased, a feedback loop including the phase detector 141 and the delay pump 142 reduces the code value Code by as much as an increment in capacitance applied through the pad PAD and reduces the delay amount of the variable delay chain. Also, when the capacitance value applied to the pad PAD is reduced, the feedback loop increases the code value Code by as much as a decrement in capacitance applied through the pad PAD and increases the delay amount of the variable delay chain. As a result, the feedback loop controls such that the phase of the sensing signal "sen" is equal to that of the fixed reference signal "ref" applied to phase detector 141, so that the capacitance value CV may correspond to the capacitance applied to the pad PAD.

Although it is described here that the reference delay value Nref applied to the subtracter "sub" is the same as a signal required to control the fixed delay chain FDC, the subtracter "sub" and the fixed delay chain FDC may be controlled differently. Also, although it is described that the capacitance measurement circuit of FIGS. 14 and 15 includes the fixed delay chain FDC, the fixed delay chain FDC may be omitted.

Figure 16:
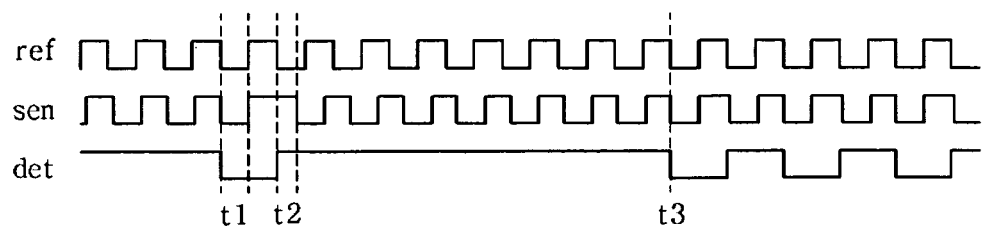
FIGS. 16 through 18 are diagrams illustrating operations of the capacitance measurement circuit of FIG. 15.
Figure 17:
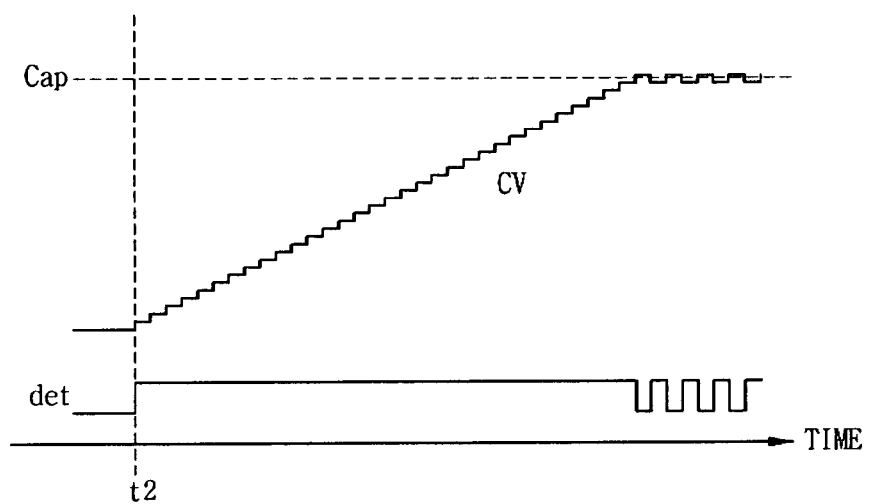
Figure 18:
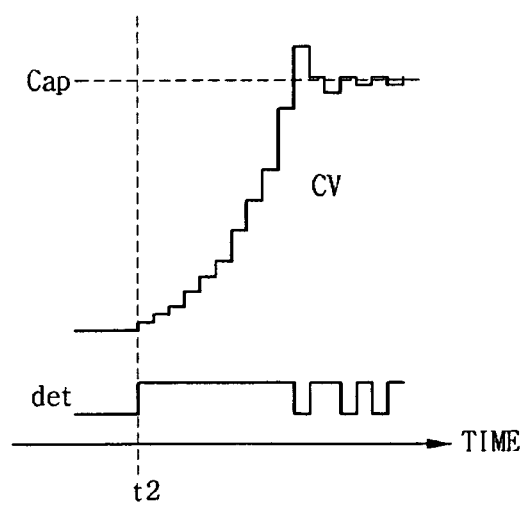

FIGS. 16 through 18 are diagrams illustrating operations of the capacitance measurement circuit of FIG. 15. Initially, FIG. 16 shows variations in a sensing signal "sen" and a detection signal "det" when a capacitance is applied to a pad PAD.

Since a reference signal ref-sig is delayed by a fixed delay unit 130 for a fixed delay time and output as a fixed reference signal "ref", the fixed reference signal ref has the same cycle as the reference signal ref_sig. Since a capacitance value CV is 0 during an initial operation of the capacitance measurement circuit, an initial code value Code is equal to a reference delay value Nref, and the time taken for the variable delay chain VDC to delay the reference signal ref_sig is equal to the time taken for the fixed delay chain FDC to delay the reference signal ref_sig. Thus, during the initial operation of the capacitance measurement circuit, the sensing signal "sen" is delayed with respect to the fixed reference signal ref due to the capacitance of the pad PAD and output to the D-flip-flop DFF.

Since the sensing signal "sen" is delayed with respect to the fixed reference signal "ref", the sensing signal "sen" is at a high level at a falling edge of the fixed reference signal "ref", and the detection signal "det" is output at a high level. Since the detection signal "det" is at a high level, the counter CNT ups the capacitance value CV and outputs 1. Since the subtracter "sub" subtracts the capacitance value CV from the reference delay value Nref and output the subtraction result, the code value Code is pumped down and output as a reference delay value (Nref)-1.

The variable delay chain VDC reduces the delay time of the reference signal ref_sig in response to the code value Code and outputs the sensing signal "sen". As the delay time of the sensing signal "sen" decreases, a difference in delay time between the sensing signal "sen" and the fixed reference signal "ref" also decreases. When the difference in delay time between the sensing signal "sen" and the fixed reference signal "ref" is gradually reduced until the delay time of the sensing signal "sen" is equal to or shorter than that of the fixed reference signal "ref" at a time point t1, the D-flip-flop DFF drops the detection signal "det" to a low level.

Thereafter, when a capacitance is externally applied through the pad PAD at a time point t2, the sensing signal "sen" is further delayed due to the applied capacitance, and the D-flip-flop DFF outputs a high-level detection signal "det". When the detection signal "det" is output at a high level, the capacitance value CV is gradually increased until the delay time of the sensing signal "sen" is equal to or shorter than that of the fixed reference signal "ref" at a time point t3 as described above. Thereafter, the capacitance value CV may be oscillated.

FIG. 17 shows a variation in capacitance value CV of a capacitance measurement circuit including a counter CNT configured to up or down the capacitance value CV by one bit, and FIG. 18 shows a variation in capacitance value CV of a capacitance measurement circuit including a counter CNT configured to down or down the capacitance value CV according to predetermined rules.

Since the counter CNT performs a count-up or count-down operation by one bit in FIG. 17, when a large capacitance is applied through the pad PAD, it takes a long amount of time for the capacitance value CV to be equal to the applied capacitance. However, since the counter CNT performs the count-up or count-down operation by one bit, even if a large noise is temporarily applied, the capacitance value CV has only a variation of 1 bit. Thus, the influence of the noise on the capacitance value CV is immaterial.

FIG. 18 illustrates a case where the counter CNT ups or downs the capacitance value CV according to a rule that when a detection signal "det" is applied at a high level or low level three times in succession, a bit number to be upped or downed is increased. Specifically, when the detection signal "det" is applied at a high level in succession, the counter CNT increases a bit number to be upped once every three times. For example, when the detection signal "det" is applied at a high level or low level in succession, the capacitance value CV is varied by one bit three times and then varied by 2 bits next three times. Also, when the detection signal "det" is dropped to a low level, the counter CNT reduces a bit number to be upped or downed and downs the capacitance value CV. Thus, even if a large capacitance is applied, the counter CNT may indicate the capacitance value CV in a short amount of time. Although the capacitance value CV of FIG. 18 may vary within a greater range than the capacitance value CV of FIG.

17 in the case of occurrence of a noise, the influence of the noise on the capacitance value CV is small because the variation range of the capacitance value CV of FIG. 18 is small. In particular, since the pad PAD is disposed within the feedback loop, the variable delay chain VDC directly receives a noise-free reference signal ref_sig and delays and outputs the reference signal ref_sig in response to the code value Code, which is obtained in consideration of a noise and applied through the pad PAD, so that the noise can be attenuated due to the characteristics of the feedback loop.

Although it is described that the data generator 140 includes a D-flip-flop DFF and an up/down counter CNT and gradually ups or downs the capacitance value CV, the data generator 140 may count a difference in delay time between the fixed reference signal ref and the sensing signal "sen" and immediately output the capacitance value CV applied to the pad PAD.

Furthermore, the delay pump 142 may further include a digital filter configured to filter and output a capacitance value CV in order to remove a noise. In the above-described embodiments, since the capacitance value CV is output within a limited variation range, a variation range of a code value Code is also limited. However, when the code value Code is varied with a predetermined range or more, it is determined that a noise is included. Thus, the delay pump 142 may further include a digital low-pass filter (LPF) or digital band-pass filter (BPF) as the digital filter which receives and filters the code value Code from the subtracter "sub" and outputs the variable delay chain VDC. Also, it is natural that the same effect can be obtained by filtering the capacitance value CV without filtering the code value Code. The digital filter may be used to control not only noise characteristics of the capacitance measurement circuit but also the characteristics of the feedback loop. Furthermore, when a difference in delay time between the fixed reference signal ref and the sensing signal "sen" is sufficiently reduced to stabilize the feedback loop, the capacitance value CV is oscillated by +1/−1 bit. However, the oscillation of the capacitance value CV may be fixed using the digital filter. That is, the digital filter may have hysteresis characteristics to prevent minute oscillation of the capacitance value CV in a steady state.

Furthermore, the counter CNT and the digital filter may be embodied in not only hardware but also software.

Figure 19:
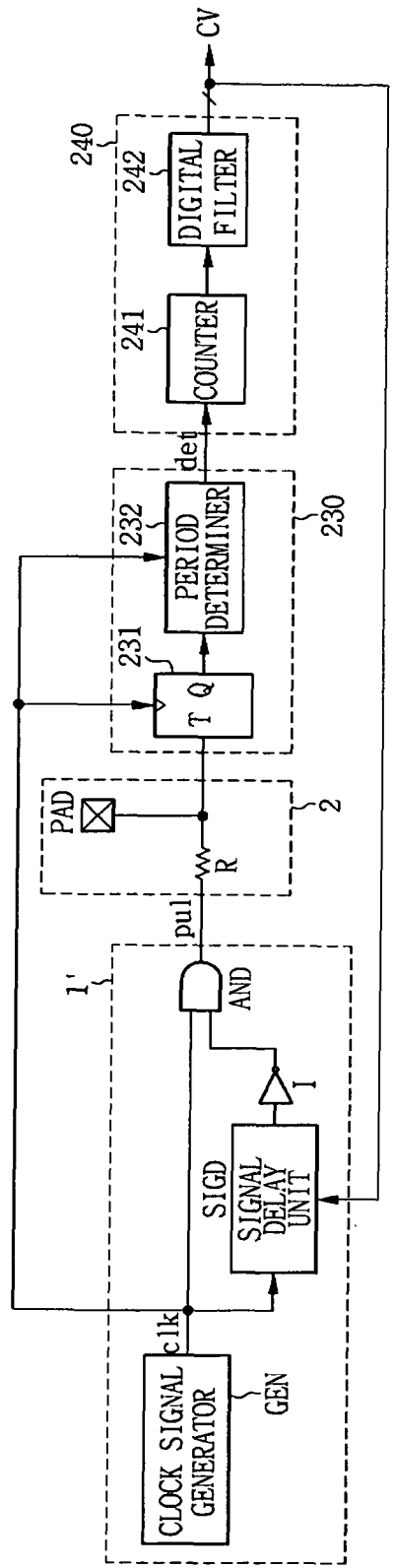
FIG. 19 is a circuit diagram of a capacitance measurement circuit according to another exemplary embodiment of the present invention.

FIG. 19 is a circuit diagram of a capacitance measurement circuit according to another exemplary embodiment of the present invention. Since a pulse signal generator 1' and a pulse signal transmitter 2 of the capacitance measurement circuit have the same configurations as in FIG. 4, a detailed description thereof will be omitted.

Also, the pulse signal detector 3 of FIG. 4 adopts only the T-flip-flop TFF. However, as described above, most noises are frequently applied through the pad PAD. Since the T-flip-flop TFF of FIG. 4 is directly connected to the pad PAD, when a noise is applied to a pulse signal "pul" through the pad PAD, there is a possibility that the T-flip-flop TFF may be toggled at least once in response to one pulse signal "pul". The T-flip-flop TFF should be toggled only once in response to one pulse signal "pul" so that a period determiner 232 of FIG. 19 can accurately determine the periodicity of the pulse signal "pul". In order to solve the above-described problem, the T-flip-flop TFF of FIG. 19 may be embodied by the toggle circuit of FIG. 20 to be toggled only once in response to one pulse signal "pul".

In a pulse signal detector 230 of FIG. 19, since the T-flip-flop 231 receives the pulse signal "pul" in response to the clock signal "clk", an output signal of the T-flip-flop 231 is not toggled due to a noise. Also, the pulse signal detector 230 of FIG. 19 may further include the period determiner 232 configured to determine whether the output signal of the T-flip-flop 231 is periodically toggled. The period determiner 232 determines whether the output signal of the T-flip-flop 231 periodically toggles in response to the clock signal "clk", outputs a low-level detection signal "det" when the output signal of the T-flip-flop 231 periodically toggles, and outputs a high-level detection signal "det" when the output signal of the T-flip-flop 231 does not periodically toggles.

Unlike the touch sensor of FIG. 4 capable of sensing only a contact or non-contact state, the capacitance measurement circuit of FIG. 19 should measure a capacitance applied through the pad PAD and output a capacitance value CV, and thus the delay pump 240 includes a counter 241 and a digital filter 242 like the capacitance measurement circuit of FIG. 15. The counter 241 is an up/down counter, which receives the detection signal "det" in response to the clock signal "clk" and ups or downs and outputs a counter value Cout by one bit or according to predetermined rules. As described above, the digital filter 242 is used to control the characteristics of a feedback loop along with the noise characteristics of the capacitance measurement circuit. The digital filter 242, which has hysteresis characteristic, filters the counter value Cout and outputs the capacitance value CV to prevent oscillation of the capacitance value CV.

Although it is described that the counter 241 receives the detection signal "det" in response to the clock signal "clk", when the counter 241 is a non-synchronous counter, the counter 241 may not receive the clock signal "clk". Also, the period determiner 232 may use other signals than the clock signal "clk" in order to determine whether the output signal of the T-flip-flop 231 periodically toggles.

In FIG. 19, the variable delay chain VDC variably delays and outputs the clock signal "clk" in response to the capacitance value CV.

Figure 20:
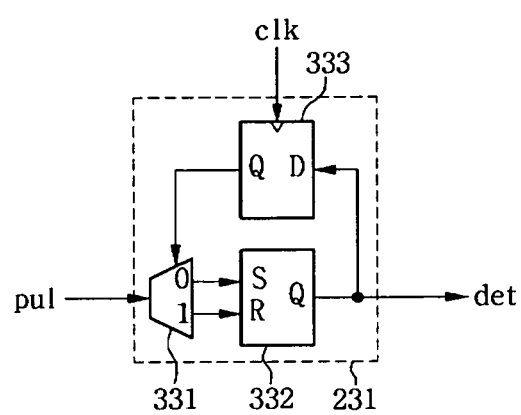
FIG. 20 is a circuit diagram of a toggle circuit of a T-flip-flop of FIG. 19.

FIG. 20 is a circuit diagram of a toggle circuit of the T-flip-flop of FIG. 19. The toggle circuit includes a single multiplexer Mux 331, an SR-flip-flop SRF 332, and a D-flip-flop DFF 333.

The multiplexer 331 may receive a pulse signal "pul" in response to the output signal of the D-flip-flop 333 and applies the pulse signal "pul" to a set terminal S or reset terminal R of the SR-flip-flop 332. The multiplexer 331 applies the pulse signal "pul" to the set terminal S when the detection signal "det" is applied at a low level, and applies the pulse signal "pul" to the reset terminal R when the detection signal "det" is applied at a high level.

The SR-flip-flop 332 maintains the level of the previous detection signal "det" when no pulse signal is applied from the multiplexer 331, outputs a high-level detection signal "det" to the delay pump 340 when a high-level signal is applied to the set terminal S, and outputs a low-level detection signal "det" when a high-level signal is applied to the reset terminal R.

The D-flip-flop 333 latches the detection signal "det" in response to the clock signal "clk" applied from the clock signal generator 311 and outputs the latched signal to the multiplexer 331.

The D-flip-flop 333 latches the detection signal "det" in response to the clock signal "clk" and determines whether the output signal of the multiplexer 331 is applied to the set terminal S or reset terminal R of the SR-flip-flop 332.

According to the present invention as described above, a touch sensor is capable of confirming if a touch object is in contact with a touch pad depending on whether a pulse signal is transmitted or not, so that the touch sensor can perform a touch sensing operation more precisely. Also, the pulse width of the pulse signal is periodically adjusted to operating conditions, thus preventing the occurrence of a malfunction in the touch sensor due to changed operating conditions. Thus, the operating reliability of the touch sensor can be enhanced. Furthermore, in a capacitance measurement circuit configured to detect a contact state according to exemplary embodiments, a pad through which a capacitance is externally applied is disposed within a feedback loop, and a capacitance value is gradually increased or reduced. As a result, the influence of a noise applied through the pad on the capacitance value can be reduced, thus enabling measurement of a precise capacitance value.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A capacitance measurement circuit comprising:
   a reference signal generator for generating a reference signal;
   a fixed delay chain for delaying the reference signal for a time corresponding to a reference delay value, and outputting the delayed reference signal; a variable delay chain for delaying the reference signal for a time corresponding to a code value, and outputting the delayed reference signal;
   a first delay unit for delaying an output signal of the fixed delay chain for a fixed time, and outputting a fixed delay signal;
   a second delay unit including a pad through which a capacitance is externally applied, the second delay unit being configured to variably delay the output signal of the variable delay chain in response to the capacitance applied through the pad and output a sensing signal; and
   a data generator for increasing or reducing and outputting the capacitance value in response to a difference in delay time between the fixed reference signal and the sensing signal, and varying and outputting the code value in response to the increased or reduced capacitance value;
   wherein the data generator comprises:
   a phase detector for outputting a detection signal in response to the difference in delay time between the fixed reference signal and the sensing signal; and
   a delay pump for gradually increasing or decreasing and outputting the capacitance value according to predetermined rules in response to the detection signal, varying the code value in response to the capacitance value, and outputting the varied code value to the variable delay chain;
   wherein the delay pump comprises:
   a counter for gradually increasing or decreasing and outputting the capacitance value according to predetermined rules in response to the detection signal; and
   a subtracter for subtracting the capacitance value from the reference delay value and outputting the code value.

2. The circuit of claim 1, wherein the phase detector is a flip-flop configured to latch the sensing signal in synchronization with a rising or falling edge of the fixed reference signal and output the detection signal.

3. The circuit of claim 1, wherein the counter gradually increases or decreases and outputs the capacitance value by a predetermined unit in response to the detection signal.

4. The circuit of claim 1, wherein when the detection signal is continuously applied at a high level or low level, the counter varies the capacitance value by a variation unit of the capacitance value and gradually increases or decreases and outputs the capacitance value.

5. The circuit of claim 1, wherein the delay pump further includes a digital filter configured to filter and output the code value or the capacitance value.

6. The circuit of claim 5, wherein the digital filter is a low-pass filter (LPF) or band-pass filter (BPF) configured to receive and stabilize the code value or the capacitance value and remove a noise.

7. The circuit of claim 5, wherein the counter and the digital filter are embodied in software.

8. The circuit of claim 1, wherein the counter receives the detection signal in response to the fixed reference signal.

9. The circuit of claim 1, wherein the counter receives the detection signal in response to the reference signal.

10. The circuit of claim 1, wherein the first delay unit is a first resistor connected between the fixed delay chain and the phase detector.

11. The circuit of claim 10, wherein the second delay unit further includes a second resistor connected between the variable delay chain and the phase detector.

* * * * *